United States Patent [19]
Dietrich

[11] 4,320,536
[45] Mar. 16, 1982

[54] SUBHARMONIC PUMPED MIXER CIRCUIT
[76] Inventor: James L. Dietrich, 1642 Baltimore, Derby, Kans. 67037
[21] Appl. No.: 76,762
[22] Filed: Sep. 18, 1979
[51] Int. Cl.³ .............................................. H04B 1/26
[52] U.S. Cl. ..................... 455/325; 333/247
[58] Field of Search ............... 455/325, 326, 327, 330; 363/159, 161; 333/246, 247, 243, 238, 239

[56] References Cited

U.S. PATENT DOCUMENTS

| | | | |
|---|---|---|---|
| 3,402,340 | 9/1968 | Ringereide | 455/325 |
| 3,571,722 | 3/1971 | Vendelin | 455/327 |
| 3,659,206 | 4/1972 | Hallford | 455/326 |
| 3,735,267 | 5/1973 | Napoli | 455/327 |
| 3,870,960 | 3/1975 | Hallford | 455/327 |
| 3,939,430 | 2/1976 | Dickens | 455/327 |
| 3,943,450 | 3/1976 | Otremba | 455/327 |
| 3,983,489 | 9/1976 | Gittinger | 455/326 |
| 4,008,438 | 2/1977 | Shinkawa | 455/327 |

OTHER PUBLICATIONS

Millimeter-Wave Receivers with Subharmonic Pump, Thomas F. McMaster, et al., IEEE Transactions on Microwave Theory and Technique, vol. MTT-24, No. 12, Dec. 1976, pp. 948-952.

*Primary Examiner*—Tommy P. Chin
*Attorney, Agent, or Firm*—Fishburn, Gold and Litman

[57] ABSTRACT

A subharmonic pumped mixer circuit utilizes quarter wavelength transmission lines at a local oscillator (LO) frequency to provide high radio frequency (RF) to local oscillator (LO) port isolation while allowing the RF and LO ports, as well as an intermediate frequency (IF) port, to be connected directly to a semiconductor switch. A transmission line supressor network connected between the semiconductor switch and the RF port allows operation at any selected even LO harmonic by suppressing response to even harmonics of the LO frequency below the selected harmonic and includes transmission line suppressors which are each a quarter wavelength at the frequency to be suppressed.

8 Claims, 6 Drawing Figures

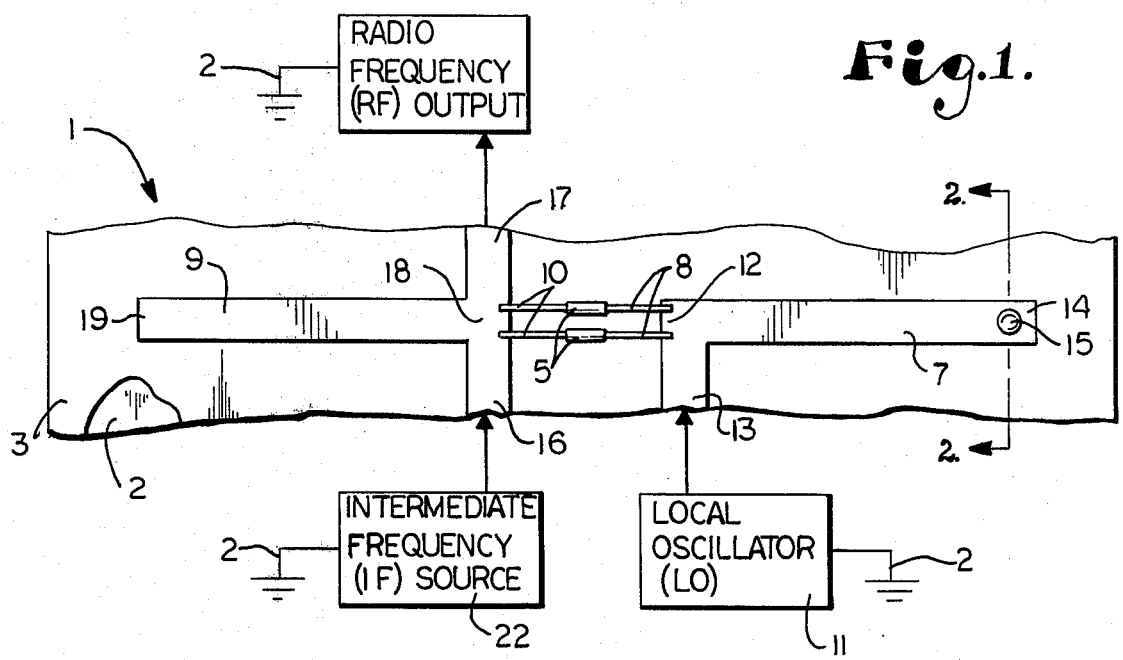
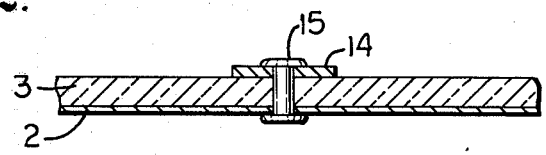
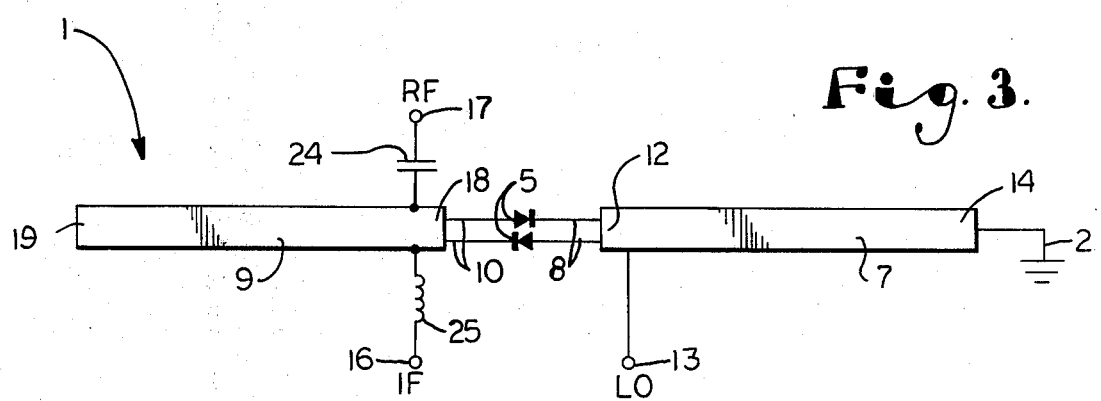

SUBHARMONIC PUMPED MIXER CIRCUIT

FIELD OF THE INVENTION

This invention relates to subharmonic pumped microwave diode mixers and, more particularly, to such a diode mixer including an embedding circuit employing respective quarter wavelength transmission lines to provide port to port isolation and to suppress response to undesired harmonics of the LO frequency.

DESCRIPTION OF THE PRIOR ART

The mechanism by which a diode mixer converts energy from one frequency to another is generally well known. A diode which is pumped by, or receives a switching signal from, a local oscillator at an LO frequency $f_{LO}$ behaves as a switch that is closed during the conducting portion of the LO voltage cycle and open during the non-conducting part of the cycle. This switching action modulates an incident signal and thereby makes available signals at numerous frequencies different from the incident signal. The relationship between the various signals is $f_{RF} = kf_{LO} \pm f_{IF}$, where k is an integer. If, for example, the incident signal is at frequency $f_{IF}$, then the available output signals $f_{RF}$ occur in pairs about harmonics of the LO frequency, $f_{LO}$.

Recently, subharmonic mixers have been utilized in which the principal output is $f_{RF} = mf_{LO} \pm f_{IF}$, that is, at a particular harmonic of the LO frequency. These mixers have used filters to block responses corresponding to k less than m, that is, at frequencies below the principal output. The main disadvantage to this type of mixer is that the conversion loss is relatively high because signal energy at frequencies below the principal output does not exit the mixer, but is largely dissipated in the mixer circuit.

A more recent type of subharmonic pumped mixer uses two diodes connected in parallel and opposing polarity, that is, antiparallel. These form a semiconductor switch which is toggled at $2f_{LO}$ and, consequently, output frequencies are available only at even harmonics of the local oscillator frequency.

As background, existing forms of the two-diode, subharmonic pumped mixers are described in literature such as: E. R. Carlson et. al, "Subharmonically Pumped Millimeter-Wave Mixers," Vol. MTT-26, pp. 706–715, Oct. 1978; M. V. Schneider and W. W. Snell, Jr., "Harmonically Pumped Stripline Down-Converter," Vol. MTT-23, pp. 271–275, Mar. 1975; and M. Cohn et. al, "Harmonic Mixing With An Antiparallel Diode Pair," Vol. MTT-23, pp. 667–673, Aug. 1975, said "MTT" volumes being the *IEEE Transactions on Microwave Theory and Techniques.* The type of device described in the references hereinabove is a single-ended mixer which utilizes rather complex filters to separate the frequencies of interest. A disadvantage is that these mixers may be difficult and expensive to produce. Further, there is a limitation of bandwidth which occurs when bandpass filters are used to separate the frequencies of interest.

An example of a balanced mixer utlizing a subharmonic pumped antiparallel diode pair is disclosed in U.S. Pat. No. 3,983,489, issued Sept. 28, 1976 to Gittinger. This type of mixer, in which transformer coupling is used to isolate the RF and LO ports, can achieve wide bandwidth in the UHF frequency range but is not usable at microwave frequencies due to limitations of the transformer devices used therein.

OBJECTS OF THE INVENTION

The principal objects of the present invention are: to provide a microwave mixer circuit having high RF port to LO port isolation, low conversion loss, and good bandwidth; to provide such a mixer circuit having high electrical performance while maintaining a low degree of complexity; to provide such a mixer which allows the diode mixing elements to interface the RF, LO, and IF ports with minimum circuit complexity; to provide such two-diode mixer circuits which operate at low conversion loss with input signals at even harmonics of the LO of higher order than two; to provide such a higher order mixer wherein an open circuit condition is presented to the diodes at all frequencies below the desired response frequency and at all harmonics of such frequencies while not severely limiting the bandwith characteristics of the RF, LO, or IF ports; and to provide such a mixer which is economical to manufacture, efficient in operation, and which is particularly well adapted for its intended purpose.

SUMMARY OF THE INVENTION

The invention accomplishes the above objectives by using an embedding circuit for the antiparallel diode pair consisting of two quarter wavelength transmission lines at the LO frequency, one line being connected to each side of the diode pair. One line is short circuited at the far end so that the LO signal may be coupled in at the junction of this line and the diodes, whereas the other line is open circuited at the far end so that the RF and IF signals are taken at the junction of this line and the diodes. For higher order mixer embodiments of this invention, additional lines are incorporated into the above circuit in order to suppress current flow through the diodes at RF frequencies other than the desired RF frequency and its harmonics. At each frequency to be suppressed, one or more quarter wavelength lines are arranged in the circuit so that a high impedance is presented to the diodes.

The invention may be best understood both as to its organization and operation together with further objects and advantages by reference to the following detailed description taken in connection with the accompanying drawings wherein are set forth, by illustration and example, certain embodiments of this invention.

The drawings constitute a part of the specification, include an exemplary embodiment, and illustrate various objects and features thereof.

BRIEF DESCRIPTION OF THE DRAWINGS

FIG. 1 is an enlarged fragmentary plan view of a mixer in accordance with the present invention and shows schematically a local oscillator, an IF source, and an RF output connected thereto.

FIG. 2 is an enlarged fragmentary cross sectional view taken on line 2—2 of FIG. 1 and showing the microstrip construction of the mixer.

FIG. 3 is a schematic diagram of the mixer of FIG. 1 including an RF coupling capacitor and an IF choke providing IF-RF port isolation.

DESCRIPTION OF THE PREFERRED EMBODIMENTS

Figure 4:
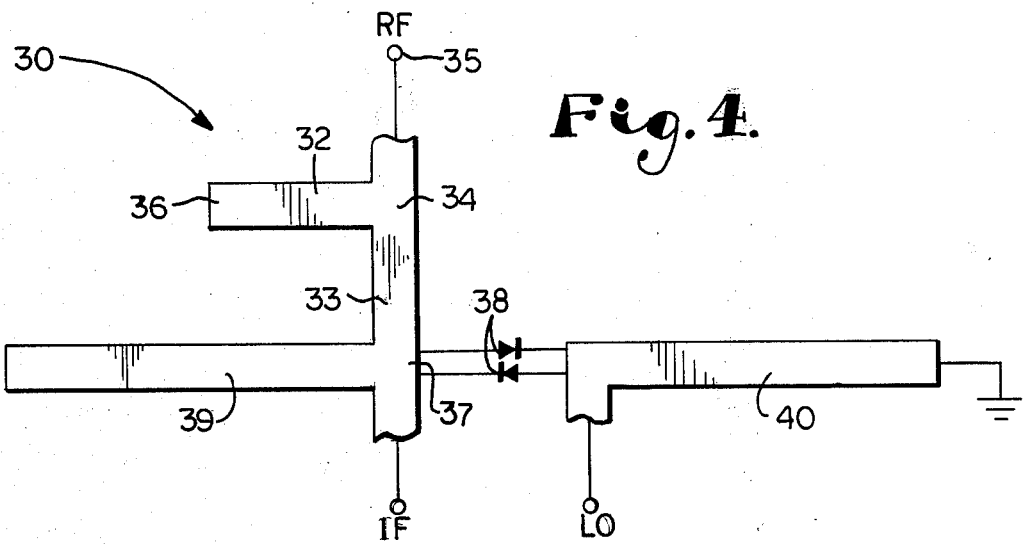
FIG. 4 is a schematic diagram of a second embodiment of the mixer according to the present invention for response at four times the LO frequency.

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but as a basis for the claims and as a representative basis for teaching one skilled in the art to variously employ the present invention in virtually any appropriately detailed structure.

Referring to the drawings in more detail:

The reference numeral 1 generally designates a subharmonic pumped microwave mixture embodying the present invention and constructed in microstrip over a ground plane 2 (FIG. 2) from which it is separated by a dielectric substrate 3. A pair of diodes 5 is connected in reverse polarity parallel, known as antiparallel (see FIG. 3). Embedding circuitry for the mixer 1 includes particularly a first transmission line 7 connected to one end or terminal 8 of the diode pair and a second transmission line 9 connected to the other end or terminal 10 of the diode pair 5. Each of the lines 7 and 9 has a length equal to one quarter wavelength at the local oscillator frequency $f_{LO}$. A local oscillator (LO) 11 is connected to the one end 12 of line 7 at an LO port 13 located adjacent the end 8 of the diode pair 5, and the other end 14 of the line 7 is short circuited to the ground plane 2 by means as represented by rivet 15. The line 9 provides an intermediate frequency (IF) port 16 and a signal or radio frequency (RF) port 17 at the end 18 of the line 9 adjacent the connection of the end 10 of the diode pair thereto. The other end 19 of the line 9 is open circuited.

In the description to follow, the resistive diode pair 5 is pumped by a strong source, the LO 11, at a frequency $f_{LO}$. A relatively weak intermediate frequency (IF) signal source 22 provides an energy input at a frequency $f_{IF}$ which is much less than $f_{LO}$. Potential mixer output signals at the RF port 17 are at frequencies $f_{RF}=kf_{LO}\pm f_{IF}$ where $k=1, 2, 3, \ldots$. That is to say RF signal outputs may occur in frequency pairs about all harmonics of the LO frequency. It should be understood that discussion of the mixer 1 in terms of an input signal at the IF port 16 is for convenience and clarity and in no way whatsoever restricts this invention to operation as a signal upconverter; indeed, the more common usage of the mixer 1, as with other mixer types, is for downconversion in receiving applications. The discussion is valid because the IF response to any of the RF frequencies is known to be directly and precisely related to the RF response to an IF signal input.

While the mixer 1 of FIG. 1 is preferred to be constructed by microstrip techniques, it will be apparent to those skilled in the art that the mixer could also readily and successfully be constructed using various alternate forms of transverse electromagnetic (TEM) mode transmission lines, such as coaxial or stripline, or combinations thereof. There may be an advantage to using one particular form of line or another based on considerations of electrical performance, size, weight, frequency, individual manufacturing capability, etc.; and it is not to be implied that microstrip construction is necessary for the proper operation and full utility of the mixer 1 to be realized.

The diodes comprising the diode pair 5 should, for best electrical performance, be of the type commonly characterized by those familiar in the art as microwave mixer diodes. The only specific or necessary requirements for these microwave mixer diodes for proper operation of mixer circuits of this invention is that, as in conventional mixers, they be specified or characterized as having a suitably high cutoff frequency for the particular RF frequency of operation. Cutoff frequency $f_{CO}$ is defined in terms of the forward bias series resistance (Rs) and the zero bias junction capacitance ($C_j$) as $f_{CO}=(2R_sC_j)^{-1}$.

It will be noted that no specific frequency restrictions are given on the device since the lengths of the lines 7 and 9 are defined in terms of wavelength. Furthermore, it will be recognized that the circuit of FIG. 1 may be readily fabricated and successfully operated at least to frequencies in the millimeter region, 30–300 GHz. Additionally, diodes that are suitably packaged or in chip form are, at this date, available with cutoff frequencies of 2000 GHz or higher, in keeping with the diode requirement given hereinabove.

Referring to FIG. 1, the effect of the mixer 1 to a local oscillator 11 connected to the LO port 13, is that the diode pair 5 is connected to the ground 2, since the line 7 reflects an open circuit to the LO port 13 at $f_{LO}$ and the line 9 reflects a short circuit to the end 10 of the diode pair 5, thus grounding the end 10. Assuming that the IF port 16 is rendered an open circuit to desired RF response frequency by a network external to the mixer 1, then at the frequency $2f_{LO}$, the effect to the RF port 17 is that the pumped diode air 5, a semiconductor switch being toggled at $2f_{LO}$, is connected to the ground 2, since the line reflects a short circuit to the LO port 13, grounding the LO side 8 of the diode 5, whereas the line 9 reflects an open circuit to the RF port 17. Furthermore, it may be seen that at the LO port 13, the line 7 presents an open circuit at all odd harmonics of the LO frequency and a short circuit to all even harmonics thereof. In a similar manner, at the RF port 17, line 9 presents a short circuit to all odd harmonics of $f_{LO}$ and an open circuit at all even harmonics thereof. It should be noted that the voltage waveform across the diode pair 5 will contain only odd harmonics of $f_{LO}$ due to the symmetrical waveform of the LO signal and the relatively matched characteristics of the diodes 5. Thus, the RF port 17 is isolated virtually totally from LO energy at $f_{LO}$ and all harmonics thereof that are generated.

Because the semiconductor switch 5 operates at a frequency of $2f_{LO}$ as a result of the resistance function of a pumped antiparallel diode pair, an IF signal at the IF port 16 can generate RF output only about even harmonics of the LO frequency, that is, $f_{RF}=kmf_{LO}\pm f_{IF}$, where $K=1, 2, 3 \ldots$, and $m=2$. The relative strength of the RF output pairs is predictable from a knowledge of the LO waveform and amplitude. With respect to the fundamental components at $k=1$, the higher order components at k greater than or equal to 2 are small and can be neglected. That is, most energy appears at the RF port 17 at a frequency $f_{RF}=2f_{LO}\pm f_{IF}$. Note that all RF energy including harmonics is isolated from the LO port 13 by virtue of the line 7 as discussed hereinabove. This isolation is important in preventing loss to the LO port 13 and minimizing conversion loss.

FIG. 3 illustrates a practical realization of the $m=2$, or second harmonic, mixer 1 of FIG. 1, using one possible means of RF-IF signal separation, namely: a coupling capacitor 24 which isolates the IF signal from the RF port 17 and an RF choke 25 which isolates the IF port 16 from RF signals. Operating information concerning the mixer 1, as shown in FIG. 1, is as follows: The LO center frequency is 2 gigahertz (GHz), the RF center frequency is 4 GHz, and the IF frequency is 30 megahertz (MHz). The conversion loss at midband (IF to one RF sideband and two RF sidebands) is respectively 5 dB and 2 dB. The LO signal level is 10 dBm (0.01 watts). The RF signal bandwidth is 800 MHz, and the IF bandwidth is DC to 400 MHz. The LO port to RF port isolation is greater than 40 db at midband and 20 dB at band edge. The IF source impedance and RF load impedance are each 50 ohms. Although the characteristic impedance $Z_o$ of the microstrip lines 7 and 9 of the mixer 1 is approximately 50 ohms, successful operation can be achieved over a wide range of $Z_o$.

Referring to FIG. 4, a second embodiment 30 of the subharmonic pumped mixer is illustrated. The mixer 30 is responsive at the fourth harmonic of the LO frequency and, therefore, employs suppressor circuit means added to the basic second harmonic mixer 1 of FIG. 1 for suppressing response at the second harmonic of $f_{LO}$ and consisting of eighth wavelength (at $f_{LO}$) lines 32 and 33. The junction 34 of these two lines is at the RF port 35. The far end 36 of the line or stub 32 is open circuited.

The line 32 provides a short circuit at the RF port 35 for all odd harmonics of the m=2 mixer output, (that is, $2f_{LO}$, $6f_{LO}$, $10f_{LO}$, etc.) thus suppressing same and preventing their exit from the RF port 35. The line 33 reflects an open circuit at these frequencies to the IF end 37 of the diode pair 38. Such an open circuit termination is an important factor in minimizing conversion loss by preventing current flow through the diodes 38 at frequencies other than the desired output frequency(s). The resulting available output frequencies are $f_{RF}=mkf_{LO}\pm f_{IF}$, k=1, 2, 3 ..., and m=4. The principal output of interest is the fundamental at k=1, that is, at $f_R=4f_{LO}\pm f_{IF}$. In all other respects, the mixer 30, including the quarter wavelength lines 39 and 40, operates in a manner similar to that described for the mixer 1.

Figure 5:
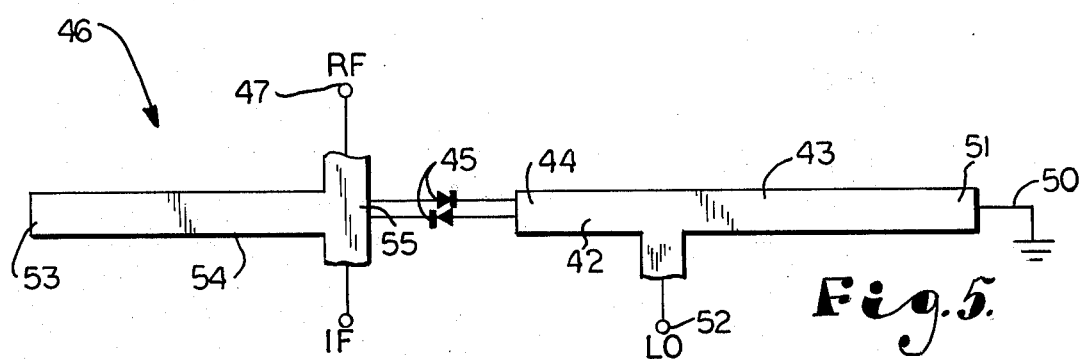
FIG. 5 is a schematic diagram of an alternative embodiment of the mixer illustrated in FIG. 4.

It is possible to construct the suppressor circuit means in a manner other than as in the mixer 30. FIG. 5 illustrates an alternative embodiment of the m=4 or fourth harmonic mixer. A single eighth wavelength ($f_{LO}$) line 42 is positioned between line 43 and the LO port side 44 of the diode pair 45. In this mixer 46 the RF port 47 is connected directly to the diode pair 45. Examination of the mixer 46 shows that all isolation and diode termination characteristics are identical to those described for the fourth harmonic mixer circuit 30 of FIG. 4.

At $2f_{LO}$, the frequency to be suppressed, and all odd harmonics thereof: the line 43, which is shorted to ground 50 at the end 51 thereof, is a half wavelength long or a multiple thereof; and the line 42 is a quarter wavelength long or an odd multiple thereof, such that a short circuit is reflected to the LO port 52 and is reflected as an open circuit to the end 44 of the diode pair 45. In a similar manner, an open circuit at the end 53 of the line 54 is reflected to the RF side 55 of the diode pair 45. Thus, current flow through the diodes 45 at $2f_{LO}$ and all harmonics thereof is prevented. At the pump frequency $f_{LO}$, the open circuit at the end 53 of the line 54 is reflected as a short circuit to the end 55 of the diodes; and the short circuit at the end 51 of line 43 is reflected as an open circuit to the LO port 52, such that the effect to a local oscillator (not shown) connected to the LO port 52 is that the diodes 45 are simply connected to the ground 50 at 55. At the desired frequency of response, $4f_{LO}$, and all harmonics thereof, the short circuit at 51 is reflected to the LO port and to the end 44 of the diodes 45, and the open circuit at 53 is reflected to the end 55 of the diodes 45. The effect to the RF port 47 is that the diodes 45 are grounded at 44, whereby RF signal energy at $4f_{LO}$ and harmonics thereof is allowed to transfer through the RF port 45 but is isolated from the LO port 52.

The m=4 mixer circuit 46 of FIG. 5 has been constructed and tested and has shown good performance. Briefly, the results were conversion loss, IF to one RF sideband, 6 dB, IF to two principal sidebands, 3 dB, and signal bandwidth about 10 percent (10%), approximately one half that of the m=2 or second harmonic mixer 1.

Figure 6:
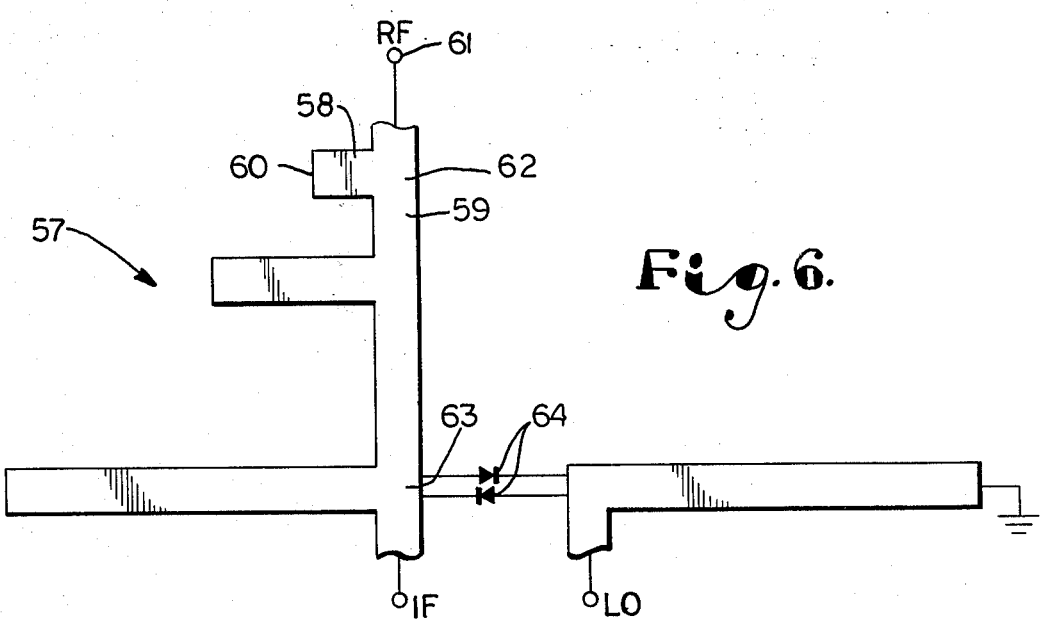
FIG. 6 is a schematic diagram of a third embodiment of the mixer for response at eight times the LO frequency.

The addition of further suppressor networks to the basic m=2 circuit can produce still higher order subharmonic mixers. FIG. 6 shows an eighth harmonic mixer 57 which consists of the m=4 mixer of FIG. 4 to which has been added suppressor lines 58 and 59 which are one sixteenth wavelength long at $f_{LO}$. The line or stub 58 is open circuited at its far end 60, and the RF stub 61 is at the junction 62 of lines 58 and 59. The output frequencies ae $f_{RF}=mkf_{LO}\pm f_{IF}$, k=1, 2, 3 ..., with m=8. The principal output is at $f_{RF}=8f_{LO}\pm f_{IF}$. At the frequency to be suppressed, $4f_{LO}$, and odd harmonics thereof, the line 58 reflects the open circuit at 60 as a short circuit to the junction 62. This short circuit is reflected as an open circuit to the IF end 63 of the diodes 64, thereby preventing current flow therethrough at $4f_{LO}$ and odd harmonics thereof. In all other respects including the suppression of $2f_{LO}$, the mixer 57 operates in a manner similar to that of the mixer 30 of FIG. 4.

What has been described and illustrated are embodiments of subharmonic pumped mixers each of which may function as an unconverter, downconverter, modulator, phase detector, or other uses readily devised by those skilled in the art. It will be understood that other such uses may be found. Further, various changes and modifications may be made to the embodiments described hereinabove without departing from the true spirit and scope of the invention as defined by the appended claims.

What is claimed and desired to secure by Letters Patent is:

1. An unbalanced subharmonic pumped mixer circuit comprising:
    (a) an antiparallel connected diode pair functioning as a semiconductor switch;
    (b) a radio frequency (RF) port, an intermediate frequency (IF) port, and a local oscillator (LO) port;
    (c) RF, IF, and LO input coupling means connected respectively to said ports for signals thereat; and
    (d) an embedding circuit interconnecting said RF, IF, and LO coupling means with said diode pair for the separation of RF, IF, and LO signals and for the mutual isolation of said RF and LO ports, said embedding circuit including two transverse electromagnetic (TEM) transmission lines operatively connected to said diode pair, each of said lines being substantially one quarter wavelength at a local oscillator frequency $f_{LO}$;

(e) a first of said transmission lines having one end operatively connected to said RF port and an opposite end open circuited to provide at said RF port a short circuit at the local oscillator frequency $f_{LO}$ and odd harmonics thereof and an open circuit at even harmonics thereof to thereby isolate said RF port from signals at $f_{LO}$ odd harmonics thereof; and (f) a second of said transmission lines having one end operatively connected to said LO port and an opposite end short circuited to provide at said LO port an open circuit at $f_{LO}$ and odd harmonics thereof and a short circuit at even harmonics thereof to thereby isolate said LO Port from signals at even harmonics of $f_{LO}$.

2. A subharmonic pumped mixer circuit comprising:
(a) an antiparallel connected diode pair functioning as a semiconductor switch;
(b) a radio frequency (RF) port, an intermediate frequency (IF) port, and a local oscillator (LO) port;
(c) RF, IF, and LO input coupling means connected respectively to said ports for signals thereat; and
(d) embedding circuit means interconnecting said RF, IF, and LO coupling means with said diode pair for the separation of RF, IF, and LO signals and for the mutual isolation of said RF and LO ports, said embedding circuit means including two transverse electromagnetic (TEM) transmission lines operatively connected to said diode pair, each line being substantially one-quarter wavelength at a local oscillator frequency $f_{LO}$; and wherein:
(e) a first of said transmission lines is connected to provide a short circuit at the local oscillator frequency $f_{LO}$ and odd harmonics thereof and an open circuit at even harmonics thereof; and
(f) a second of said transmission lines is connected to provide an open circuit at $f_{LO}$ and odd harmonics thereof and a short circuit at even harmonics thereof; and wherein said mixer is a higher order mixer for response at said RF port at a frequency $f_{RF}$ which is substantially an even harmonic of $f_{LO}$ greater than two, and including:
(g) suppressor circuit means for suppressing response at selected even harmonics of $f_{LO}$ which are below $f_{RF}$ and at odd harmonics of said selected even harmonics, said suppressor circuit means including at least one suppressor line for each said selected even harmonic to be suppressed, said line having a length which is substantially one-quarter wavelength at said selected even harmonic to be suppressed thereby, said line being positioned and connected in said mixer circuit in such a manner as to effect a blockage of RF signal current flow through said diode pair at all odd harmonics of said selected even harmonic to be suppressed to thereby permit only signal energy at $f_{RF}$ and even harmonics thereof to pass through said RF port.

3. A subharmonic pumped mixer circuit comprising:
(a) an antiparallel connected diode pair functioning as a semiconductor switch;
(b) a radio frequency (RF) port, an intermediate frequency (IF) port, and a local oscillator (LO) port;
(c) RF, IF, and LO input coupling means connected respectively to said ports for signals thereat; and
(d) embedding circuit means interconnecting said RF, IF, and LO coupling means with said diode pair for the separation of RF, IF, and LO signals and for the mutual isolation of said RF and LO ports, said embedding circuit means including two transverse electromagnetic (TEM) transmission lines operatively connected to said diode pair, each line being substantially one-quarter wavelength at a local oscillator frequency $f_{LO}$; and wherein:
(e) a first of said transmission lines is connected to provide a short circuit at the local oscillator frequency $f_{LO}$ and odd harmonics thereof and an open circuit at even harmonics thereof;
(f) a second of said transmission lines is connected to provide an open circuit at $f_{LO}$ and odd harmonics thereof and a short circuit at even harmonics thereof; and
(g) suppressor circuit means including at least one suppressor line having a length which is approximately one-eighth wavelength at $f_{LO}$, said line being positioned and connected in said mixer circuit to effect a blockage of RF signal current flow through said diode pair at all odd harmonics of the second harmonic ($2f_{LO}$) of the local oscillator frequency, thereby permitting only signal energy at even harmonics of $2f_{LO}$ to pass through said RF port.

4. A subharmonic pumped mixer circuit comprising:
(a) an antiparallel connected diode pair functioning as a semiconductor switch;
(b) a radio frequency (RF) port, an intermediate frequency (IF) port, and a local oscillator (LO) port;
(c) RF, IF, and LO input coupling means connected respectively to said ports for signals thereat; and
(d) embedding circuit means interconnecting said RF, IF, and LO coupling means with said diode pair for the separation of RF, IF, and LO signals and for the mutual isolation of said RF and LO ports, said embedding circuit means including two transverse electromagnetic (TEM) transmission lines operatively connected to said diode pair, each line being substantially one-quarter wavelength at a local oscillator frequency $f_{LO}$; and wherein:
(e) a first of said transmission lines is connected to provide a short circuit at the local oscillator frequency $f_{LO}$ and odd harmonics thereof and an open circuit at even harmonics thereof;
(f) a second of said transmission lines is connected to provide an open circuit at $f_{LO}$ and odd harmonics thereof and a short circuit at even harmonics thereof; and
(g) a plurality of connecting lines and stub lines arranged and connected so as to inhibit RF signal current flow through said diode pair and signal energy flow through said RF port at all frequencies except a selected even harmonic of the local oscillator frequency and harmonics of said even harmonic.

5. A subharmonic pumped mixer circuit comprising:
(a) an antiparallel connected diode pair functioning as a semiconductor switch;
(b) a radio frequency (RF) port, an intermediate frequency (IF) port, and a local oscillator (LO) port;
(c) RF, IF, and LO input coupling means connected respectively to said ports for signals thereat; and
(d) embedding circuit means interconnecting said RF, IF, and LO coupling means with said diode pair for the separation of RF, IF, and LO signals and for the mutual isolation of said RF and LO ports, said embedding circuit means including two transverse electromagnetic (TEM) transmission lines operatively connected to said diode pair, each line being substantially one-quarter wavelength at a local oscillator frequency $f_{LO}$; and wherein:

(e) a first of said transmission lines is connected to provide a short circuit at the local oscillator frequency $f_{LO}$ and odd harmonics thereof and an open circuit at even harmonics thereof; and (f) a second of said transmission lines is connected to provide an open circuit at $f_{LO}$ and odd harmonics thereof and a short circuit at even harmonics thereof;

(g) said first of said embedding circuit transmission lines has one end of said diode pair and said RF and IF coupling means connected to one end thereof and has the other end thereof open circuited; and (h) the second of said embedding circuit transmission lines has an opposite end of said diode pair and said LO coupling means connected to one end thereof and has the other end thereof shorted to a circuit ground.

6. A mixer circuit as set forth in claim 5 wherein said mixer is adapted for response at said RF port at a frequency which is substantially the fourth harmonic of $f_{LO}$, said mixer circuit further including:

(a) a first suppressor line interposed between said RF coupling means and said one end of said first of said embedding circuit means transmission lines, said first suppressor line having a length substantially equal to one eighth wavelength at $f_{LO}$; and (b) a second suppressor line having one end thereof connected to said first suppressor line at the junction of said RF coupling means and said first suppressor line and the other end thereof open circuited, said second suppressor line having a length substantially equal to said first suppressor line, and said second suppressor line, in cooperation with said first suppressor line, suppressing response at said RF port at the second harmonic of $f_{LO}$.

7. A mixer circuit as set forth in claim 5 wherein said mixer is adapted for response at said RF port at a frequency which is substantially the fourth harmonic of $f_{LO}$, said mixer circuit further including:

a suppressor line interposed between said opposite end of said diode pair and said one end of said second of said embedding circuit transmission lines, said suppressor line having a length which is substantially one eighth wavelength at $f_{LO}$, whereby response at said RF port at the second harmonic of $f_{LO}$ is suppressed.

8. A mixer circuit as set forth in claim 5 wherein said mixer is adapted for response at said RF port at a frequency which is substantially the eighth harmonic of $f_{LO}$, said mixer circuit further including:

(a) a first suppressor line interposed between said RF coupling means and said one end of said first of said embedding circuit transmission lines, said first suppressor line having a length which is substantially one eighth wavelength at $f_{LO}$;

(b) a second suppressor line interposed between said first suppressor line and said RF coupling means, said second suppressor line having a length which is substantially one sixteenth wavelength at $f_{LO}$;

(c) a third suppressor line having one end thereof connected at the junction of said first and second suppressor lines and an opposite end thereof open circuited, said third suppressor line having a length which is substantially one eighth wavelength at $f_{LO}$ and, in cooperation with said first suppressor line, suppressing response at said RF port at the second harmonic of $f_{LO}$ and further odd harmonics of $2f_{LO}$; and (d) a fourth suppressor line having one end thereof connected at the junction of said second suppressor line and said RF coupling means and an opposite end thereof open circuited, said fourth suppressor line having a length which is substantially equal to one sixteenth wavelength at $f_{LO}$ and, in cooperation with said second suppressor line, suppressing response at said RF port at the fourth harmonic of $f_{LO}$ and further odd harmonics of $4f_{LO}$.

* * * * *